(12) United States Patent
Jayaraman et al.

(10) Patent No.: US 11,960,435 B2
(45) Date of Patent: Apr. 16, 2024

(54) SKEW MATCHING IN A DIE-TO-DIE INTERFACE

(71) Applicant: ADVANCED MICRO DEVICES, INC., Santa Clara, CA (US)

(72) Inventors: Pradeep Jayaraman, Santa Clara, CA (US); Dean Gonzales, Fort Collins, CO (US); Gerald R. Talbot, Boxborough, MA (US); Ramon A. Mangaser, Boxborough, MA (US); Michael J. Tresidder, Austin, TX (US); Prasant Kumar Vallur, Bangalore (IN); Srikanth Reddy Gruddanti, Bangalore (IN); Krishna Reddy Mudimela Venkata, Bangalore (IN); David H. McIntyre, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/692,147

(22) Filed: Mar. 10, 2022

(65) Prior Publication Data

US 2023/0195678 A1    Jun. 22, 2023

(30) Foreign Application Priority Data

Dec. 17, 2021   (IN) .............................. 202111059016

(51) Int. Cl.
*G06F 13/42* (2006.01)
*H01L 25/065* (2023.01)

(52) U.S. Cl.
CPC ...... *G06F 13/4291* (2013.01); *G06F 13/4286* (2013.01); *H01L 25/0652* (2013.01)

(58) Field of Classification Search
CPC ............ G06F 13/4291; G06F 13/4286; H01L 25/0652
See application file for complete search history.

(56) References Cited

U.S. PATENT DOCUMENTS

| 9,245,870 B1* | 1/2016 | Peterson ............... G06F 30/392 |
| 10,424,921 B2 | 9/2019 | Dubowski et al. |
| 11,574,670 B2 | 2/2023 | Moon et al. |
| 11,693,808 B2 | 7/2023 | Noguera Serra et al. |

(Continued)

FOREIGN PATENT DOCUMENTS

WO    2016060780 A1    4/2016

OTHER PUBLICATIONS

International Search Report and Written Opinion, PCT/US2022/052736, dated Mar. 27, 2023, 8 pages.

*Primary Examiner* — Henry Tsai
*Assistant Examiner* — John B Roche

(57) ABSTRACT

A semiconductor package for skew matching in a die-to-die interface, including: a first die; a second die aligned with the first die such that each connection point of a first plurality of connection points of the first die is substantially equidistant to a corresponding connection point of a second plurality of connection points of the second die; and a plurality of connection paths of a substantially same length, wherein each connection path of the plurality of connection paths couples a respective connection point of the first plurality of connection points to the corresponding connection point of the second plurality of connection points.

20 Claims, 5 Drawing Sheets

(56) References Cited

U.S. PATENT DOCUMENTS

| | | | |
|---|---|---|---|
| 2007/0232091 A1* | 10/2007 | Hong | H01R 13/6471 439/66 |
| 2013/0318266 A1 | 11/2013 | Thomas et al. | |
| 2016/0034417 A1* | 2/2016 | Chavez | G05B 19/4185 710/110 |
| 2016/0147708 A1* | 5/2016 | Freudenberger | G06F 13/4291 710/110 |
| 2016/0170934 A1* | 6/2016 | Haejong | G06F 13/4291 710/110 |
| 2017/0063353 A1* | 3/2017 | Coteus | G06F 1/12 |
| 2022/0206608 A1* | 6/2022 | Shin | G06F 3/04164 |

\* cited by examiner

Align A First Die With A Second Die Such That Each Connection Point Of A First Plurality Of Connection Points Of The First Die Is Substantially Equidistant To A Corresponding Connection Point Of A Second Plurality Of Connection Points Of The Second Die 402

Couple Each Connection Point Of The First Plurality Of Connection Points To The Corresponding Connection Point Of The Second Plurality Of Connection Points Using A Plurality Of Connection Paths Of A Substantially Same Length 404

FIG. 4

Align A First Die With A Second Die Such That Each Connection Point Of A First Plurality Of Connection Points Of The First Die Is Substantially Equidistant To A Corresponding Connection Point Of A Second Plurality Of Connection Points Of The Second Die 402

Couple Each Connection Point Of The First Plurality Of Connection Points To The Corresponding Connection Point Of The Second Plurality Of Connection Points Using A Plurality Of Connection Paths Of A Substantially Same Length 404

Couple A Clock To The First Die And The Second Die 502

FIG. 5

SKEW MATCHING IN A DIE-TO-DIE INTERFACE

BACKGROUND

A die-to-die interface communicatively couples dies to allow for data transfer between the dies. Data is transferred using multiple concurrently active connection paths. As an example, a byte is transferred between dies by transmitting each bit value for the byte simultaneously across multiple connection paths. Where the lengths of the connection paths varies, portions of data (e.g., each bit) transmitted at the same time will arrive at different times. This varying time of data arrival is known as "skew."

BRIEF DESCRIPTION OF THE DRAWINGS

FIG. 4 is a flowchart of an example method for skew matching in a die-to-die interface according to some implementations.

FIG. 5 is a flowchart of another example method for skew matching in a die-to-die interface according to some implementations.

DETAILED DESCRIPTION

Figure 1:
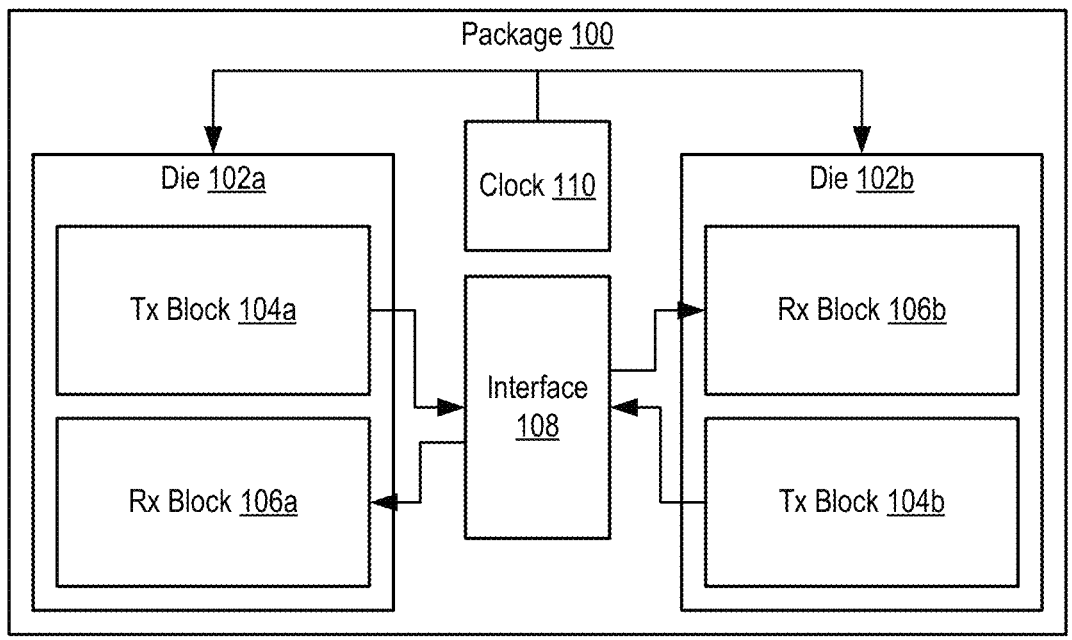
FIG. 1 is a block diagram of an example semiconductor package for skew matching in a die-to-die interface according to some implementations.

Existing solutions for addressing skew include training the recipient dies to sample received data at the correct timing, or to reconstruct the received datagrams in order to accommodate for the skew in data transmission. These approaches require additional overhead and complex logic.

To that end, the present specification sets forth various implementations for skew matching in a die-to-die interface. In some implementations, a semiconductor package for skew matching in a die-to-die interface includes a first die and a second die aligned with the first die such that each connection point of a first plurality of connection points of the first die is substantially equidistant to a corresponding connection point of a second plurality of connection points of the second die. The semiconductor package also includes a plurality of connection paths of a substantially same length, where the paths couple each connection point of the first plurality of connection points to the corresponding connection point of the second plurality of connection points.

In some implementations of the semiconductor package, a layout of the first plurality of connection points corresponds to a one-hundred-and-eighty-degree rotation of a layout of the second plurality of connection points after alignment of the first die and the second die. In some implementations, a transmit block of the first die is linearly aligned with a receive block of the second die and a transmit block of the second die is linearly aligned with a receive block of the first die. In some implementations, the semiconductor package further includes a clock coupled to the first die and the second die. In some implementations, the first plurality of connection points and the second plurality of connection points each include a first subset of connection points for data transfer and a second subset of connection points for clocking. In some implementations, the first die and the second die each provide a respective source-synchronous clocking signal with a respective data signal. In some implementations, the respective source-synchronous clocking signal is in quadrature with the respective data signal.

The present specification also describes various implementations of a method for skew matching in a die-to-die interface. Such a method includes aligning a first die with a second die such that each connection point of a first plurality of connection points of the first die is substantially equidistant to a corresponding connection point of a second plurality of connection points of the second die; and coupling each connection point of the first plurality of connection points to the corresponding connection point of the second plurality of connection points using a plurality of connection paths of a substantially same length.

In some implementations of the method, a layout of the first plurality of connection points corresponds to a one-hundred-and-eighty-degree rotation of a layout of the second plurality of connection points after alignment of the first die and the second die. In some implementations, after aligning the first die with the second die, a transmit block of the first die is linearly aligned with a receive block of the second die and a transmit block of the second die is linearly aligned with a receive block of the first die. In some implementations, the method further includes coupling a clock to the first die and the second die. In some implementations, the first plurality of connection points and the second plurality of connection points each include a first subset of connection points for data transfer and a second subset of connection points for clocking. In some implementations, the first die and the second die each provide a respective source-synchronous clocking signal with a respective data signal. In some implementations, the respective source-synchronous clocking signal is in quadrature with the respective data signal.

Also described in this specification are various implementations of an apparatus for skew matching in a die-to-die interface. Such an apparatus includes computer memory and a semiconductor package operatively coupled to the computer memory. The semiconductor package includes a first die and a second die aligned with the first die such that each connection point of a first plurality of connection points of the first die is substantially equidistant to a corresponding connection point of a second plurality of connection points of the second die. The semiconductor package also includes plurality of connection paths of a substantially same length, where the connection paths couple each connection point of the first plurality of connection points to the corresponding connection point of the second plurality of connection points.

In some implementations of the apparatus, a layout of the first plurality of connection points corresponds to a one-hundred-and-eighty-degree rotation of a layout of the second plurality of connection points after alignment of the first die and the second die. In some implementations, a transmit block of the first die is linearly aligned with a receive block of the second die and a transmit block of the second die is linearly aligned with a receive block of the first die. In some implementations, the apparatus further includes a clock coupled to the first die and the second die. In some implementations, the first plurality of connection points and the second plurality of connection points each include a first subset of connection points for data transfer and a second subset of connection points for clocking. In some implementations, the first die and the second die each provide a respective source-synchronous clocking signal with a respective data signal.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows include implementations in which the first and second features are formed in direct contact, and also include implementations in which additional features be formed between the first and second features, such that the first and second features are not in direct contact. Further, spatially relative terms, such as "beneath," "below," "lower," "above," "upper," "back," "front," "top," "bottom," and the like, are used herein for ease of description to describe one element or feature's relationship to another element(s) or feature(s) as illustrated in the figures. Similarly, terms such as "front surface" and "back surface" or "top surface" and "back surface" are used herein to more easily identify various components, and identify that those components are, for example, on opposing sides of another component. The spatially relative terms are intended to encompass different orientations of the device in use or operation in addition to the orientation depicted in the figures.

FIG. 1 is a block diagram of a non-limiting example package 100. The example package 100 can be implemented in a variety of computing devices, including mobile devices, personal computers, peripheral hardware components, gaming devices, set-top boxes, and the like. The package 100 is a semiconductor package such as a processor. Such a processor is implemented, for example, in a computer as a central processing unit (CPU), as a processor or core on a parallel accelerator such as a graphics processing unit (GPU), machine learning accelerator, and the link, or otherwise implemented as can be appreciated by one skilled in the art.

The package 100 includes a die 102a and a die 102b. The dies 102a,b are portions of semiconductive material such as silicon onto which functional circuitry is fabricated. In some implementations, the dies 102a,b are system-on-chip (SoC) dies, chiplets, or other functional semiconductor dies as can be appreciated. In some implementations, the package 100 includes substrate such as a printed circuit board (PCB) to which the dies 102a,b are coupled. In some implementations, the dies 102a,b are housed or encapsulated in an encapsulant or other molding material. In some implementations, the dies 102a,b, are mounted on or bonded to a carrier wafer or other structural support component.

The dies 102a,b each include a plurality of input/output (I/O) connection points. Each I/O connection point is an area of conductive surface through which signals (e.g., data signals, clock signals) are provided to or from the dies 102a,b. As an example, the I/O connection points include pins, bumps, or other components as can be appreciated. In the example package 100, the dies 102a,b each include a respective transmitting (Tx) block 104a,b and receiving (Rx) block 106a,b. Each Tx block 104a,b of a given die 102a,b includes a plurality of I/O connection points allocated or dedicated to transmitting signals to the Rx block 106a,b of the other die 102a,b. Conversely, each Rx block 106a,b of a given die 102a,b includes a plurality of I/O connection points allocated or dedicated to receiving signals (e.g., data signals, clock signals) from the Tx block 104a,b of the other die 102a,b.

The dies 102a,b are communicatively coupled by an interface 108. In the example package 100, the interface 108 couples the dies 102a,b by coupling the Tx blocks 104a,b of each die 102a,b to the Rx block 106a,b of the other die 102a,b. The interface 108 includes a plurality of connection paths. Each connection path in the interface 108 couples an I/O connection point of a die 102a,b (e.g., from the Tx block 104a,b) to another I/O connection point of the other die 102a,b (from the Rx block 106a,b). As an example, the connection paths include conductive traces, wires, pins, vias, or other connection paths as can be appreciated.

In some implementations, the interface 108 includes a bridge die. A bridge die is a die of semiconductive material (e.g., silicon) onto which the connection paths are fabricated. In some implementations, the interface 108 includes conductive traces (e.g., fanout traces or other traces as can be appreciated) housed or fabricated in one or more redistribution layers. Such redistribution layers include successive layers of dielectric material such as polyamide into which conductive traces and other conductive materials (e.g., pads, plates, vias, and the like) are housed in order to form the conductive connection pathways between dies 102a,b.

In existing solutions for die-to-die communications, the dies 102a,b are aligned and the connection pathways of the interface 108 are formed such that pairs of I/O connection points located closer together are coupled using shorter connection paths in the interface 108 while pairs of I/O connection points located further apart are coupled using longer connection paths (e.g., using a "clamshell" or other pattern of conductive traces). Thus, conductive pathways of differing lengths in the interface 108 are used to couple the dies 102a,b.

During data transmission between dies 102a,b, multiple signals are concurrently transmitted between dies 102a,b using multiple connection paths in the interface 108. As an example, a frame or other datagram is transmitted between dies 102a,b across multiple connection paths. Due to the differing lengths of the connection paths, signals transmitted simultaneously from one die 102a,b will arrive at different times at the other die 102a,b, resulting in a "skew" in the signals and data. Existing solutions to address these concerns require training of a Rx block 106a,b sampler to sample received signals at the correct time in order to reconstruct the received data, or to align the data received at different times into the correct datagrams.

Instead, to address these concerns, the dies 102a,b are aligned in the package 100 such that each pair of I/O connection points are substantially equidistant. In other words, each I/O connection point of the first die 102 is located a substantially same distance from its corresponding I/O connection point in the second die 102b. Each pair of I/O connection points are connected using a connection path in the interface 108 of a substantially same length. As each connection path has approximately the same length and the same conductive characteristics, a simultaneous transmission of multiple signals from one die 102a,b will be received substantially simultaneously at the other die 102a,b.

To facilitate the formation of equal length connection paths in the interface 108, in some implementations, a layout of the I/O connection points in a first die 102a (e.g., in the Tx block 104a and Rx block 106a) corresponds to a one-hundred-and-eighty-degree rotation of a layout of the I/O connection points in the second die 102b (e.g., in the Tx block 104*b* and the Rx block 106*b*). In other words, the layout of the I/O connection points in the first die 102*a* is flipped once across each of the X-axis and Y-axis in order to define the layout of the I/O connection points in the second die 102*b*.

Figure 2:
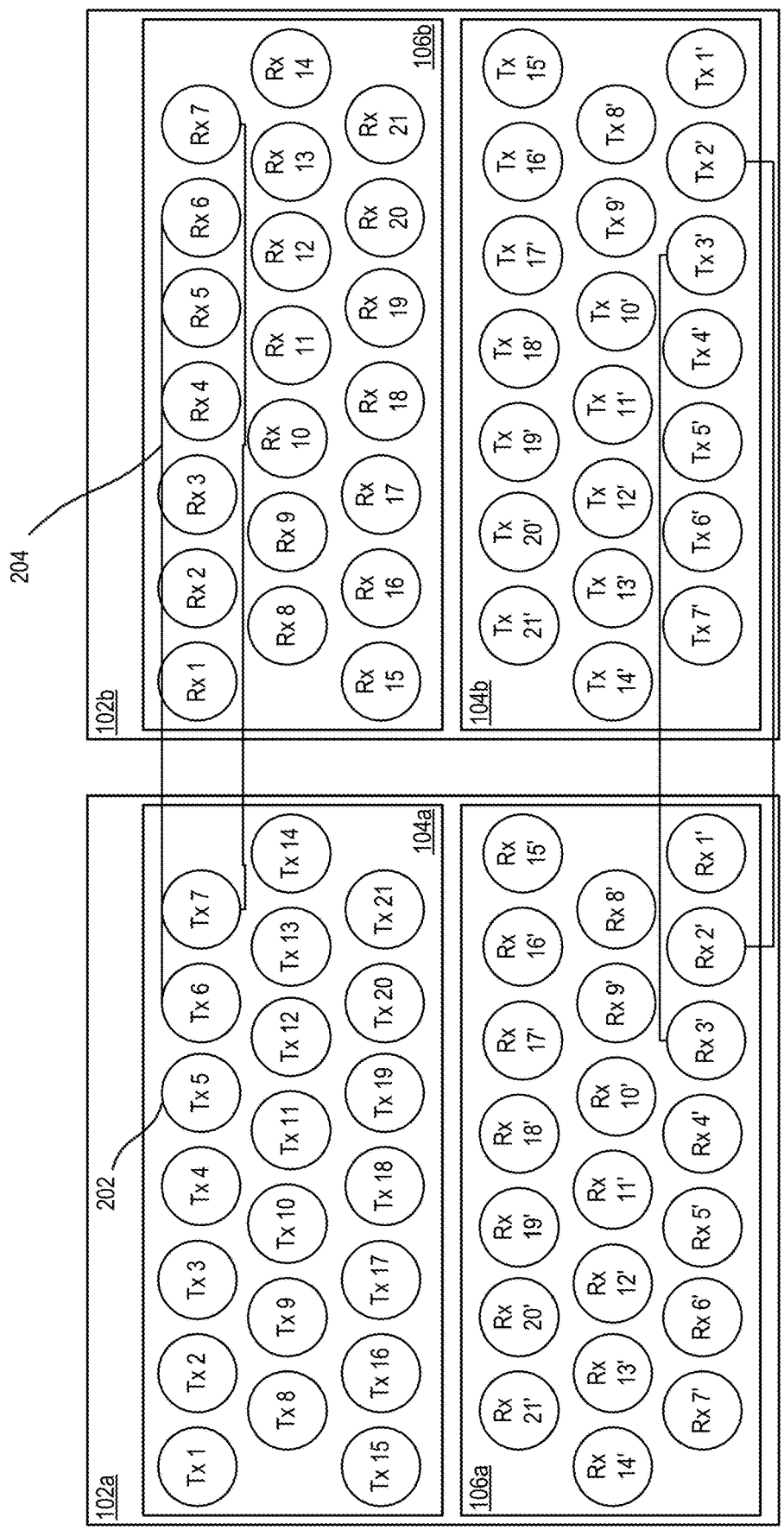
FIG. 2 is diagram of an example layout for input/output connection points for skew matching in a die-to-die interface according to some implementations.

Consider the example of FIG. 2 showing an example layout of I/O connection points for die-to-die communications. FIG. 2 shows a die 102*a* placed side-by-side with a die 102*b*. Each die 102*a,b* includes multiple I/O connection points 202 grouped into respective Tx blocks 104*a,b* and Rx blocks 106*a,b*. The Tx block 104*a* of the die 102*a* is linearly aligned with the Rx block 106*b* of the die 102*b*, and the Tx block 104*b* of the die 102*b* is linearly aligned with the Rx block 106*a* of the die 102*a*.

Each I/O connection point 202 includes a label "Tx 1"-"Tx 21," "Rx 1"-"Rx 21," Tx 1'-Tx21'" and "Rx1'-Rx21'." As shown, the I/O connection points of the die 102*b* reflect a one-hundred-and-eighty-degree rotation of the I/O connection points of the die 102*a*. As an example, I/O connection point 202 "Tx 1" is located in the upper left corner of the Tx block 104*a*. A matching I/O connection point 202 "Tx 1" is located in the lower right corner of the Tx block 104*b*. As another example, I/O connection point 202 "Rx 7" is located in the lower left corner of the Rx block 106*a*. A matching I/O connection point 202 "Rx 7'" is located in the upper right corner of the Rx block 106*b*. In other words, as shown in FIG. 2, the dies 102*a,b* are constructed to have matching layouts of I/O connection points 202, with one die 102*a,b* being rotated one-hundred-and-eighty-degrees for placement (e.g., in a package 100). To align the pairs of I/O connection points 202.

Assume that some transmitting I/O connection points 202 of a die 102*a,b* are connected via an interface 108 (not shown) a receiving I/O connection point 202 in the other die 102*a,b* having a same numbered label. In the example of FIG. 2, connection paths 204 are used to couple I/O connection points 202 "Tx 6" with "Rx 6," "Tx 7" with "Rx 7," "Tx 3'" with "Rx 3'" and "Tx 2'" with "Rx 2'." As shown, due to their relative placements, each pair of coupled I/O connection points 202 are substantially the same distance apart, and are thus couplable using connection paths 204 of substantially the same length.

One skilled in the art will appreciate that the example layout of FIG. 2 is merely illustrative and that other layouts and configurations of dies 102*a,b*, I/O connection points 202, and connection paths 204 are also contemplated within the scope of the present disclosure.

Turning back to FIG. 1, in some implementations, the package 100 also includes a clock 110. The clock 110 generates a signal oscillating at a particular frequency in order to drive the timing of data transmissions by Tx blocks 104*a,b* and the sampling of data by Rx blocks 106*a,b*. In some implementations, in order to further prevent skew across die-to-die data transmissions, a clock signal is provided, from the clock, into the Tx blocks 104*a,b* to drive the timing of transmissions by the Tx blocks 104*a,b*. In some implementations, instead of the clock 110 directly providing a clock signal to the Rx blocks 106*a,b* the Tx blocks 104*a,b* provide clock signals via the interface 108 to the respective Rx blocks 106*a,b*. Such a clock signal provided from Tx blocks 104*a,b* to Rx blocks 104*a,b* is considered a "forwarded" or "source-synchronous" clock signal. The Rx blocks 106*a,b* then sample received signals using the received clock signal. In other words, in some implementations, each Tx block 104*a,b* and Rx block 106*a,b* includes a subset of I/O connection points for data transfer and a subset of I/O connection points for clocking.

In some implementations, each Tx block 104*a,b* sends the clock signal in quadrature with data signals. In other words, the clock signal is shifted ninety degrees relative to the transmitted data signals. The clock signal is transmitted in the interface 108 using connection paths of a same distance relative to those connection paths used to transmit data signals. Thus, skew in the clock signal is avoided due to both data and clock signals being sent via connection paths of the substantially same length. Although FIG. 1 does not show direct connections between the clock 110 and the Tx blocks 104*a,b*, one skilled in the art will appreciate that this is for clarity and that, in some implementations, the clock 110 provides a clock signal directly to the Tx blocks 104*a,b* that is then forwarded by the Tx blocks 104*a,b* to the Rx blocks 106*a,b*. In some implementations, the connection paths from the clock 110 to the Tx blocks 104*a,b* are of a substantially same length to further avoid skew of the clock signal.

In some implementations, the package 100 of FIG. 1 is implemented in a computer 300. For example, the package 100 is implemented as at least one processor 302. In addition to at least one processor 302, the computer 300 of FIG. 3 includes random access memory (RAM) 304 which is connected through a high speed memory bus 306 and bus adapter 308 to processor 302 and to other components of the computer 300. Stored in RAM 304 is an operating system 310. The operating system 310 in the example of FIG. 3 is shown in RAM 304, but many components of such software typically are stored in non-volatile memory also, such as, for example, on data storage 312, such as a disk drive.

Figure 3:
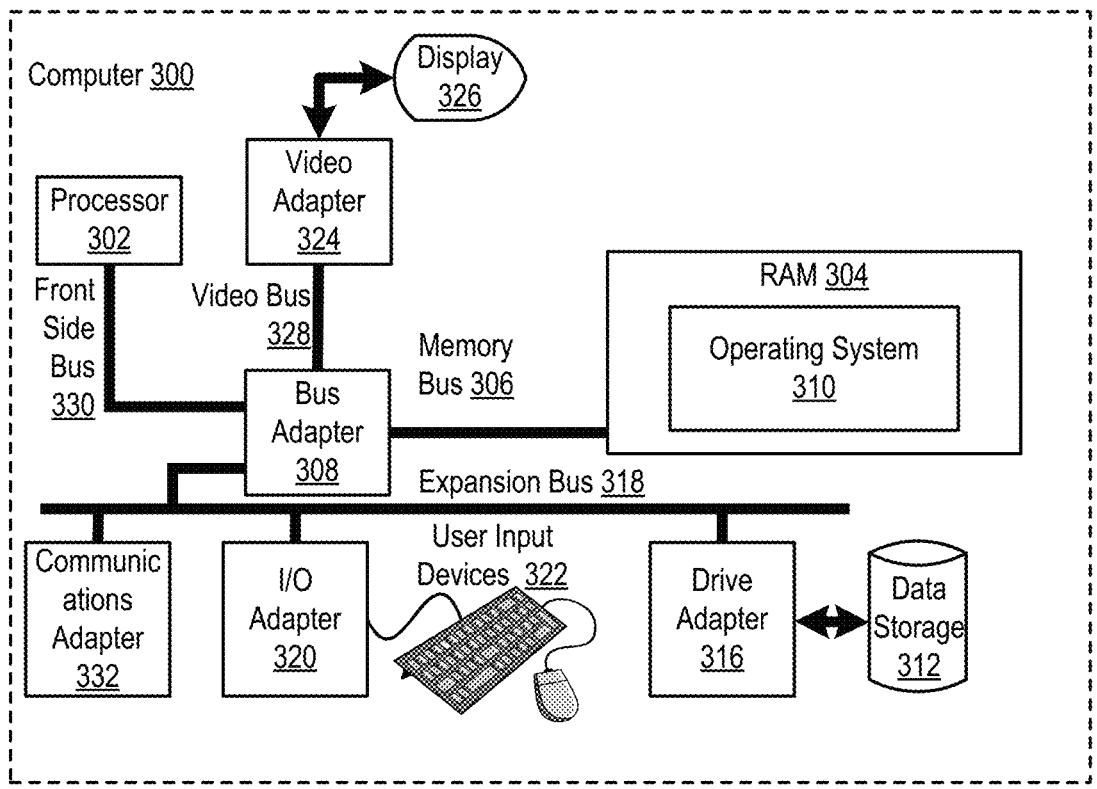
FIG. 3 is a block diagram of an example computer for skew matching in a die-to-die interface according to some implementations.

The computer 300 of FIG. 3 includes disk drive adapter 316 coupled through expansion bus 318 and bus adapter 308 to processor 302 and other components of the computer 300. Disk drive adapter 316 connects non-volatile data storage to the computer 300 in the form of data storage 312. Such disk drive adapters include Integrated Drive Electronics ('IDE') adapters, Small Computer System Interface ('SCSI') adapters, and others as will occur to those of skill in the art. In some implementations, non-volatile computer memory is implemented as an optical disk drive, electrically erasable programmable read-only memory (so-called 'EEPROM' or 'Flash' memory), RAM drives, and so on, as will occur to those of skill in the art.

The example computer 300 of FIG. 3 includes one or more input/output ('I/O') adapters 320. I/O adapters implement user-oriented input/output through, for example, software drivers and computer hardware for controlling output to display devices such as computer display screens, as well as user input from user input devices 322 such as keyboards and mice. The example computer 300 of FIG. 3 includes a video adapter 324, which is an example of an I/O adapter specially designed for graphic output to a display device 326 such as a display screen or computer monitor. Video adapter 324 is connected to processor 302 through a high speed video bus 328, bus adapter 308, and the front side bus 330, which is also a high speed bus.

The exemplary computer 300 of FIG. 3 includes a communications adapter 332 for data communications with other computers and for data communications with a data communications network. Such data communications are carried out serially through RS-232 connections, through external buses such as a Universal Serial Bus ('USB'), through data communications networks such as IP data communications networks, and/or in other ways as will occur to those of skill in the art. Communications adapters 332 implement the hardware level of data communications through which one computer sends data communications to another computer, directly or through a data communications network. Such communication adapters 332 include modems for wired dial-up communications, Ethernet (IEEE 802.3) adapters for wired data communications, and 802.11 adapters for wireless data communications.

For further explanation, FIG. 4 sets forth a flow chart illustrating an example method for skew matching in a die-to-die interface that includes aligning 402 a first die 102a with a second die 102b such that each connection point of a first plurality of connection points of the first die 102a is substantially equidistant to a corresponding connection point of a second plurality of connection points of the second die 102b. The first plurality of connection points and the second plurality of connection points include, for example, I/O connection points 202. The connection points provide access points to the dies 102a,b for the transmission or reception of signals, including data signals and clock signals. In some implementations, the connection points are grouped in the dies 102a,b into a block of connection points for transmitting signals (e.g., Tx blocks 104a,b) and a block of connection points for receiving signals (e.g., Rx blocks 106a,b).

In some implementations, the first die 102a is aligned with the second die 102b during fabrication of a semiconductor package (e.g., a package 100). For example, the first die 102a and second die 102b are placed on a carrier or other mechanical support and then encapsulated using an encapsulant or molding material. In some implementations, a Tx block 104a of the first die 102a is linearly aligned with the Rx block 106b of the second die 102b, and the Tx block 104b of the second die 102b is linearly aligned with the Rx block 106a of the first die 102a.

In some implementations, a layout of the first plurality of connection points corresponds to a one-hundred-and-eighty-degree rotation of a layout of the second plurality of connection points after alignment of the first die 102a and the second die 102b. In other words, the first die 102a and the second die 102b have matching connection point layouts. By virtue of a one-hundred-and-eighty-degree rotation of one of the dies 102a,b, the Tx block 104a and Rx block 106a of the first die 102a is linearly aligned with the Tx block 104b and Rx block 106b of the second die 102b. Thus, the pairs of connection points across dies 102a,b to be coupled are substantially equidistant after alignment.

The method of FIG. 4 also includes coupling 404 each connection point of the first plurality of connection points to the corresponding connection point of the second plurality of connection points using a plurality of connection paths of a substantially same length. In some implementations, the plurality of connection paths are include in an interface 108 coupling the first die 102a and the second die 102b. The interface 108 includes a plurality of connection paths. Each connection path in the interface 108 couples an I/O connection point of a die 102a,b (e.g., from the Tx block 104a,b) to another I/O connection point of the other die 102a,b (from the Rx block 106a,b). As an example, the connection paths include conductive traces, wires, pins, vias, or other connection paths as can be appreciated.

In some implementations, the interface 108 includes a bridge die. A bridge die is a die of semiconductive material (e.g., silicon) onto which the connection paths are fabricated. In some implementations, the interface 108 includes conductive traces (e.g., fanout traces or other traces as can be appreciated) housed or fabricated in one or more redistribution layers. Such redistribution layers include successive layers of dielectric material such as polyamide into which conductive traces and other conductive materials (e.g., pads, plates, vias, and the like) are housed in order to form the conductive connection pathways between dies 102a,b.

As each connection path has approximately the same length and the same conductive characteristics, a simultaneous transmission of multiple signals from one die 102a,b will be received substantially simultaneously at the other die 102a,b. Thus, skew in data transfer between the first die 102a and the second die 102b is remedied without the need for phase training or alignment, or frame training or alignment.

For further explanation, FIG. 5 sets forth a flow chart illustrating an example method for skew matching in a die-to-die interface according to some implementations of the present disclosure. The method of FIG. 5 is similar to FIG. 4 in that the method of FIG. 5 includes: aligning 402 a first die 102a with a second die 102b such that each connection point of a first plurality of connection points of the first die 102a is substantially equidistant to a corresponding connection point of a second plurality of connection points of the second die 102b; and coupling 404 each connection point of the first plurality of connection points to the corresponding connection point of the second plurality of connection points using a plurality of connection paths of a substantially same length.

The method of FIG. 5 differs from FIG. 4 in that the method of FIG. 5 includes coupling 502 a clock 110 to the first die 102a and the second die 102b. The clock 110 generates a signal oscillating at a particular frequency in order to drive the timing of data transmissions by Tx blocks 104a,b and the sampling of data by Rx blocks 106a,b. In some implementations, in order to further prevent skew across die-to-die data transmissions, a clock signal is provided, from the clock, into the Tx blocks 104a,b to drive the timing of transmissions by the Tx blocks 104a,b. In some implementations, instead of the clock 110 directly providing a clock signal to the Rx blocks 106a,b the Tx blocks 104a,b provide clock signals via the interface 108 to the respective Rx blocks 106a,b. Such a clock signal provided from Tx blocks 104a,b to Rx blocks 104a,b is considered a "forwarded" or "source-synchronous" clock signal. The Rx blocks 106a,b then sample received signals using the received clock signal. In other words, in some implementations, each Tx block 104a,b and Rx block 106a,b includes a subset of I/O connection points for data transfer and a subset of I/O connection points for clocking.

In some implementations, each Tx block 104a,b sends the clock signal in quadrature with data signals. In other words, the clock signal is shifted ninety degrees relative to the transmitted data signals. The clock signal is transmitted in the interface 108 using connection paths of a same distance relative to those connection paths used to transmit data signals. Thus, skew in the clock signal is avoided due to both data and clock signals being sent via connection paths of the substantially same length. Although FIG. 1 does not show direct connections between the clock 110 and the Tx blocks 104a,b, one skilled in the art will appreciate that this is for clarity and that, in some implementations, the clock 110 provides a clock signal directly to the Tx blocks 104a,b that is then forwarded by the Tx blocks 104a,b to the Rx blocks 106a,b. In some implementations, the connection paths from the clock 110 to the Tx blocks 104a,b are of a substantially same length to further avoid skew of the clock signal.

In view of the explanations set forth above, readers will recognize many benefits of skew matching in a die-to-die interface, including, for example, improved performance of a computing system by remedying skew in die-to-die communications without frame training of phase training.

Exemplary implementations of the present disclosure are described largely in the context of a fully functional computer system for skew matching in a die-to-die interface. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package for skew matching in a die-to-die interface, comprising:
   a first die;
   a second die aligned with the first die such that each connection point of a first plurality of connection points of the first die is equidistant to a corresponding connection point of a second plurality of connection points of the second die, wherein a transmit block of the first die is linearly aligned with a receive block of the second die and a transmit block of the second die is linearly aligned with a receive block of the first die; and
   a plurality of connection paths of a same length, wherein each connection path of the plurality of connection paths couples a respective connection point of the first plurality of connection points to the corresponding connection point of the second plurality of connection points.

2. The semiconductor package of claim 1, wherein a layout of the first plurality of connection points is different from a layout of the second plurality of connection points.

3. The semiconductor package of claim 1, wherein an interface between the first die and the second die includes a bridge die.

4. The semiconductor package of claim 1, further comprising a clock coupled to the first die and the second die.

5. The semiconductor package of claim 4, wherein the first plurality of connection points and the second plurality of connection points each comprise a first subset of connection points for data transfer and a second subset of connection points for clocking.

6. The semiconductor package of claim 5, wherein the first die and the second die each provide a respective source-synchronous clocking signal with a respective data signal.

7. The semiconductor package of claim 6, wherein the respective source-synchronous clocking signal is in quadrature with the respective data signal.

8. A method of skew matching in a die-to-die interface, the method comprising:
   aligning a first die with a second die such that each connection point of a first plurality of connection points of the first die is equidistant to a corresponding connection point of a second plurality of connection points of the second die, wherein, after aligning the first die with the second die, a transmit block of the first die is linearly aligned with a receive block of the second die and a transmit block of the second die is linearly aligned with a receive block of the first die; and
   coupling each connection point of the first plurality of connection points to the corresponding connection point of the second plurality of connection points using a connection path, wherein each of the connection paths comprises a same length.

9. The method of claim 8, wherein a layout of the first plurality of connection points is different from a layout of the second plurality of connection points.

10. The method of claim 8, wherein an interface between the first die and the second die includes a bridge die.

11. The method of claim 9, further comprising coupling a clock to the first die and the second die.

12. The method of claim 11, wherein the first plurality of connection points and the second plurality of connection points each comprise a first subset of connection points for data transfer and a second subset of connection points for clocking.

13. The method of claim 12, wherein coupling the clock the first die and the second die comprises configuring the first die and the second die to each provide a respective source-synchronous clocking signal with a respective data signal.

14. The method of claim 13, wherein the respective source-synchronous clocking signal is in quadrature with the respective data signal.

15. An apparatus for skew matching in a die-to-die interface, comprising:
   computer memory;
   a semiconductor package operatively coupled to the computer memory, comprising:
      a first die;
      a second die aligned with the first die such that each connection point of a first plurality of connection points of the first die is equidistant to a corresponding connection point of a second plurality of connection points of the second die, wherein a transmit block of the first die is linearly aligned with a receive block of the second die and a transmit block of the second die is linearly aligned with a receive block of the first die; and
      a plurality of connection paths of a same length, wherein each connection path of the plurality of connection paths couples a respective connection point of the first plurality of connection points to the corresponding connection point of the second plurality of connection points.

16. The apparatus of claim 15, wherein a layout of the first plurality of connection points is different from a layout of the second plurality of connection points.

17. The apparatus of claim 15, wherein an interface between the first die and the second die includes a bridge die.

18. The apparatus of claim 15, wherein the semiconductor package further comprises a clock coupled to the first die and the second die.

19. The apparatus of claim 18, wherein the first plurality of connection points and the second plurality of connection points each comprise a first subset of connection points for data transfer and a second subset of connection points for clocking.

20. The apparatus of claim 19, wherein the first die and the second die each provide a respective source-synchronous clocking signal with a respective data signal.

* * * * *